United States Patent [19]

Beyer et al.

[11] 4,069,068

[45] Jan. 17, 1978

[54] SEMICONDUCTOR FABRICATION METHOD FOR IMPROVED DEVICE YIELD BY MINIMIZING PIPES BETWEEN COMMON CONDUCTIVITY TYPE REGIONS

[75] Inventors: Klaus D. Beyer, Poughkeepsie; Gobinda Das, Beacon; Michael R. Poponiak, Newburgh; Tsu-Hsing Yeh, Poughkeepsie, all of N.Y.

[73] Assignee: International Business Machines Corporation, Armonk, N.Y.

[21] Appl. No.: 701,789

[22] Filed: July 2, 1976

[51] Int. Cl.² .................. H01L 21/265; H01L 29/32
[52] U.S. Cl. ..................................... 148/1.5; 357/88; 357/91
[58] Field of Search .................. 148/1.5; 357/91, 88

[56] References Cited

U.S. PATENT DOCUMENTS

| | | | |
|---|---|---|---|
| 3,457,632 | 7/1969 | Dolan et al. | 148/1.5 X |
| 3,540,925 | 11/1970 | Athanas et al. | 148/1.5 X |
| 3,622,382 | 11/1971 | Brack et al. | 148/1.5 X |
| 3,663,308 | 5/1972 | Davey | 148/1.5 |
| 3,756,861 | 9/1973 | Payne et al. | 148/1.5 |
| 3,796,929 | 3/1974 | Nicholas et al. | 148/1.5 X |
| 3,874,936 | 4/1975 | d'Hervilly et al. | 148/1.5 |
| 3,880,675 | 4/1975 | Tarui et al. | 148/1.5 |
| 3,948,694 | 4/1976 | Mills | 148/1.5 X |
| 4,025,364 | 5/1977 | Smith | 148/1.5 |

OTHER PUBLICATIONS

Barson et al., "Gettering Technique", IBM Tech. Discl. Bull., vol. 15, No. 6, Nov. 1972, p. 1752.
Bogardus et al., "Gettering Technique & Structure", Ibid., vol. 16, No. 4, Sept. 1973, pp. 1066–1067.
Nagasaki et al., "Gettering Technique and Structure", Ibid., vol. 17, No. 12, May 1975, pp. 3587–3588.
Cass et al., "Anomalous Residual Damage . . . Arsenic Implantations", Applied Physics Letters, vol. 23, No. 5, Sept. 1973, pp. 268–270.

Primary Examiner—L. Dewayne Rutledge
Assistant Examiner—W. G. Saba
Attorney, Agent, or Firm—Edward W. Brown

[57] ABSTRACT

A method for fabricating bipolar semiconductor devices of large scale integration in which the formation of pipes, which result in shorts or leakages between two conductivity types of the semiconductor devices, is minimized. Prior to forming the emitters in the bipolar transistors, nucleation sites for crystallographic defects such as dislocation loops are formed in the base region near its surface. The emitters are then formed in base regions containing the nucleation sites and the sites are converted into electrically harmless dislocation loops during diffusion of the emitter impurity. Preferably, the nucleation sites are formed by implanting non-doping impurities, such as helium, neon, argon, krypton, xenon, silicon, and oxygen.

9 Claims, 8 Drawing Figures

SEMICONDUCTOR FABRICATION METHOD FOR IMPROVED DEVICE YIELD BY MINIMIZING PIPES BETWEEN COMMON CONDUCTIVITY TYPE REGIONS

BACKGROUND OF THE INVENTION

The invention relates to a method of improving integrated circuit semiconductor yields and, more specifically to a method of minimizing pipes which result in shorts or leakages between two conductivity types of the semiconductor devices.

The present aim in semiconductor integrated circuit technology is to achieve higher and higher levels of integration by exceeding a density of about several thousand circuits per square millimeter on a semiconductor wafer. Because of this high packing density, the presence of microdefects such as precipitates, migration of impurities, in addition to crystallographic defects like dislocations, stacking faults, having a dominating influence on yield, performance and reliability of the semiconductor devices. These defects generally cause pipes in the bulk silicon material resulting in shorts between emitter and collector, lower breakdowns, soft junctions, non-uniform doping, and many changes of the carrier lifetime, of resistivity, etc. which in turn result in modifications of some of the important device parameters such as gain, leakage currents, saturation voltage, etc. with undesired secondary consequences regarding power dissipation, noise generation, etc.

The pipe phenomenon is well known in the semiconductor art. There are a number of types, one of which results from the surface microdefects in the silicon wafer substrate on which is formed the epitaxial layer. These are upwardly extending pipes or dislocation lines. Another type of pipe results from microdefects in the surface and body of the epitaxial layer. These are downwardly extending pipes or dislocation lines and are the type to be addressed by the present invention. For example, pipes in NPN transistors appear as N-type regions extending from the N emitter region to reach the N collector region through the P-type base region. More specifically, crystallographic defects such as stacking faults and dislocations often act as sites for pipe information. Enhanced diffusion often takes place along these defects particularly along dislocation lines. This results in emitter-collector shorts or leakages which as previously stated, are detrimental to good device performances.

SUMMARY OF THE INVENTION

Accordingly it is the primary object of this invention to provide a new and improved method for increasing the yields of semiconductor devices of large scale integration.

It is another object of the present invention to provide a new and improved method which minimizes pipes between common conductivity types.

It is further the object of the present invention to minimize such pipes without substantially complicating the method of making the device and without causing any detrimental effects to the operating characteristics of the device.

The foregoing objects are achieved in the present invention by introducing nucleation sites into those regions of a semiconductor device which are to function as emitters, and subsequently introducing emitter impurities into said regions, now having the nucleation sites, to form the emitter regions, whereby the nucleation sites are converted into small electrically harmless dislocation loops thereby minimizing the formation of pipes. By this method, detrimental defects, which are either subsequently introduced in further processing steps or are already present, are prevented from migrating to the junction region.

Preferably, the introduction of nucleation sites is brought about by ion implanting non-doping impurities such as inert gases of helium, neon, argon, krypton and xenon, with argon being the preferred impurity of the inert gases. Additional non-doping impurities are silicon and oxygen. Other means of introducing said nucleation sites are also possible, such as mechanical damage, radiation beams, like laser, which also have dislocation loop generation capabilities.

BRIEF DESCRIPTION OF THE DRAWINGS

The foregoing and other objects, features, and advantage of the invention will be apparent from the following more particular description of the preferred embodiments of the invention as illustrated in the accompanying drawings.

DESCRIPTION OF THE PREFERRED EMBODIMENTS

With reference to FIGS. 1 – 4, there is described an embodiment of the present invention where a P-type silicon substrate is utilized to form an NPN type semiconductor device. It will be understood, of course, that the invention will also be applicable to opposite conductivity type bipolar transistors as well as other types of devices.

Figure 1:
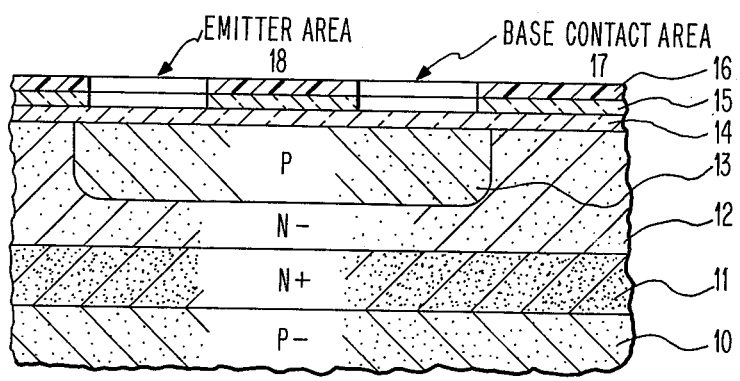
FIGS. 1 – 4 are cross-sectional views of a portion of an NPN conventional bipolar transistor fabricated according to one embodiment of the present invention.

In FIG. 1, a suitable substrate, such as wafer 10 of P-material, is formed with an N+ region 11, using conventional photoresist and etching techniques. The N+ region 11 is formed by thermally diffusing an N+ impurity such as phosphorus, arsenic, antimony or the like through a conventional silicon dioxide window. For reasons well known to those skilled in the art, arsenic is preferable for forming region 11 which will subsequently serve as the buried subcollector of the NPN transistor. To insure that the subcollector series resistance for the NPN transistor is sufficiently low, the initial concentration of arsenic or antimony should be between $6 \times 10^{19}$ to $2 \times 10^{20}$ atoms/cm$^3$.

An epitaxial layer 12 of N-type conductivity is grown over or deposited on the surface of the N+ region 11. The thickness of layer 12 is preferably between around 1.5 to 3 microns at doping level of $\leq 10^{16}$ atoms/cm$^3$. During the deposition process, region 11 partially outdiffuses into epitaxial layer 12. This property, as well as the techniques for forming an epitaxial layer, are well known in the art and are not claimed to be inventive in themselves.

Next, the P region 13 is formed and will serve as the base of the NPN transistor. Herein, region 13 is formed by diffusion of boron from boron tribromide, but again the techniques and materials are conventional in the art. The depth of region 13 is preferably about 7000 A, but can be varied as desired by those skilled in the art. The surfaces of regions 12 and 13 are thermally oxidized in the usual manner. For example, the silicon substrate 10 may be placed in an oxidizing atmosphere in an elevated temperature in steam or dry oxygen. This is by far the most common method of oxidizing silicon, although pyrolytic deposition of silicon dioxide or other insulating materials may also be used. The thickness of the silicon dioxide layer 14 in the present instance is about 800 A. On the surface of the layer 14 is deposited a layer of silicon nitride 15 which preferably is accomplished by flowing a mixture of ammonia, silane and a carrier gas of nitrogen at a temperature of around 1000° C over the layer 14 until a thickness of around 1600 A is achieved. A photoresist layer 16 is applied onto the layer 15 and, using conventional photolithographic and etching techniques, windows are formed and define the base contact area 17 and the emitter contact area 18. The silicon nitride layer 15, which is exposed by the windows formed in layer 16 may be etched in hot phosphoric acid or any other etchant which does not attach the silicon dioxide layer 14. The photoresist layer 16 is then completely removed. If desired, a dry etching technique as described in U.S. Pat. No. 3,795,557 can be employed to remove the silicon nitride layer 15 in the windows as is known and understood by those skilled in the art.

Figure 2:
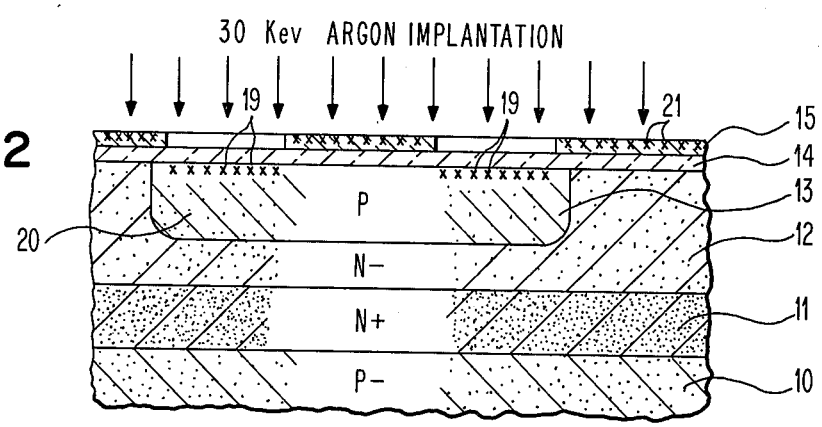

In FIG. 2, in accordance with the present invention, nucleation sites for dislocation loops 19 are introduced into the base region 13 near the interface of the region 13 and the oxide layer 14, prior to the formation of the emitter region. Preferably, the nucleation sites are formed by ion implanting a nondoping impurity; herein, argon. In order to prevent an ion implant penetration in the portion 20 base region 13 below the emitter region to be subsequently formed, a low energy argon implant of 30 Kev at a dose of $10^{16}$ at/cm$^2$ is utilized. According to LSS range statistics, 30 Kev argon has a projected range of 250 A in silicon dioxide ($\sigma \approx 66A$), 194 A in silicon nitride ($\sigma \approx 52A$) and 319A in silicon ($\sigma \approx 101A$) (Semiconductor and Related Material, by J. F. Gibbons, W. S. Johnson, and S. W. Mylroic, 2nd Ed, Dowden, Hutchinson and Ross, Inc., Stroudsburg, Pa. 1975, which is incorporated into the specification by reference.) It can be seen from this data that the portions of the silicon dioxide layer 14 in windows 17 and 18 prevent the argon ions from reaching the base region. However, the argon ions dislodge silicon and oxygen atoms in the layer 14 and drive them into the base region to create the nucleation sites 19.

While argon has been described as the preferred nondoping impurity ion, other inert gases can be employed, such as helium, neon, krypton, and xenon, as well as silicon and oxygen. The energy and dosage can be determined by reference to the above-cited book to limit depth of penetration above the portion 20 of the base region. In general, the depth of penetration must be less than about 25% of depth of the emitter region to be formed. For example, if the depth of the emitter region is to be 5000 A, the maximum depth of penetration should be around 1250 A.

It will be understood that, while, in the above description, the argon ions are implanted into the silicon dioxide layer, the energy and dosage can be such to implant the non-doping impurity ions directly into the base region either by selecting the ion, energy, and/or dosage such that the ions pass through the silicon dioxide layer or by etching the silicon dioxide layer 14 away in the window of the emitter contact area 18 prior to implantation.

Besides the nucleation sites introduced into the base region in the emitter area to be formed, nucleation sites are also introduced in base contact area of the base region. During subsequent thermal cycle, these sites in base contact area convert to dislocation loops which perform a gettering function. Of course microdefects 21 are also formed in the silicon nitride layer 15 during the implant step.

Figure 3:
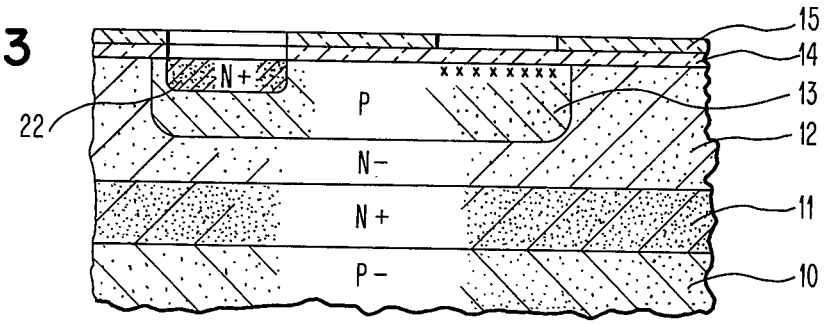
Figure 4:
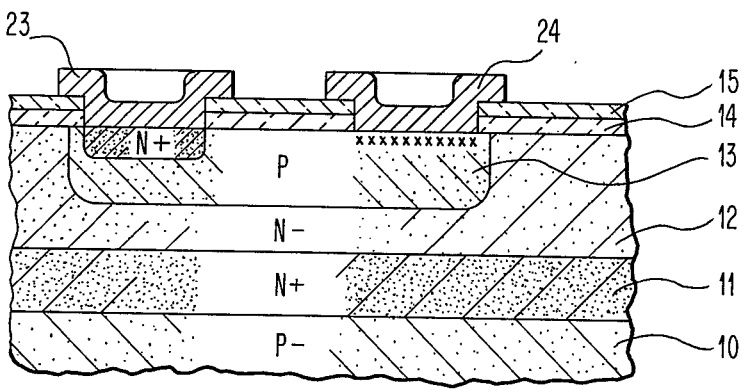
Figure 5:
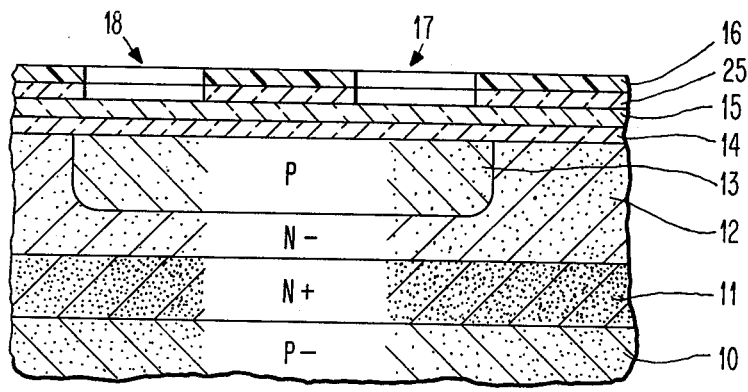
FIGS. 5 – 8 are cross-sectional views of a portion of an NPN conventional bipolar transistor fabricated according to another embodiment of the present invention.

After first coating the base area window 17 with photoresist, the silicon dioxide layer 14 in the emitter area window 18 is removed by etching with a solution of hydroflouric acid buffered in ammonium fluoride, an etchant which does not attach silicon nitride. Alternatively, a dry etch process can be employed using known techniques. As shown in FIG. 3, the N+ region 22 is formed by thermally diffusing an N+ impurity such as phosphorus, arsenic, antimony or the like, with arsenic being preferred. Herein, the depth of diffusion is about 5000 A. During the diffusion step of the N+ impurity, the nucleation sites previously formed by the ion implantation step are converted into small electrically harmless dislocation loops.

To complete the NPN transistor, a metallized emitter contact 23 and base contact 24, after removal of the silicon dioxide layer in the base region 17 using the etchant technique described above, are formed; for example, by vacuum depositing aluminum. A collector contact (not shown) is also formed in the same manner.

Another embodiment of the present invention is shown in FIGS. 5 – 8. In this embodiment, a pyrolytic oxide layer 25 of about 1000 A is deposited on the silicon nitride layer 15. After removal of the pyrolytic oxide layer 25, the silicon nitride layer 15 and the thermally grown oxide layer 14 in the base area 17 and emitter area 18, a pyrolytic oxide layer 26 (FIG. 6) of about 800 A is redeposited in those areas.

Figure 6:
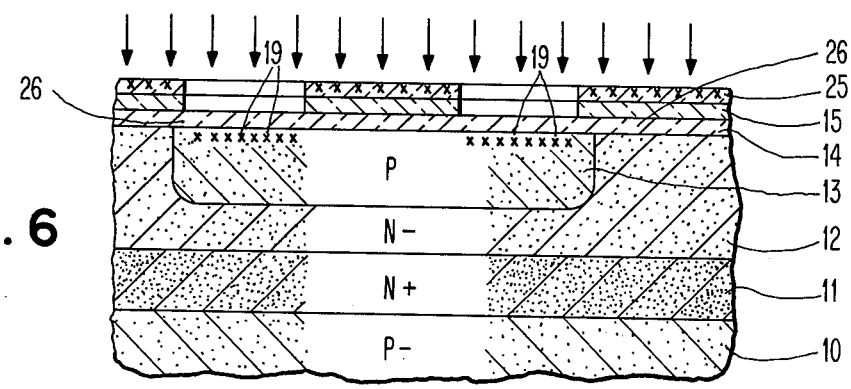
Figure 7:
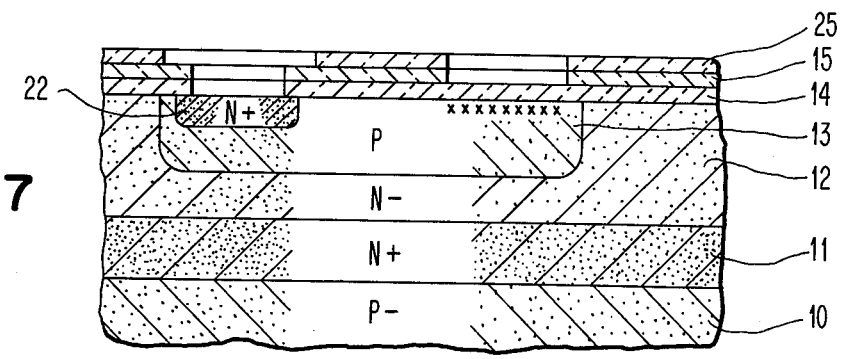
Figure 8:
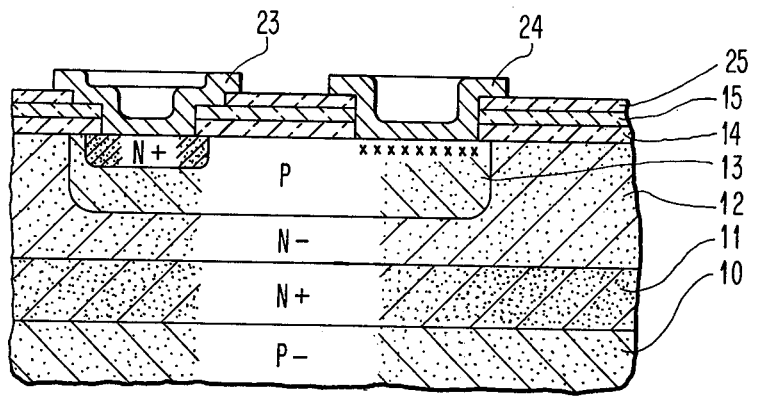

As shown in FIG. 6, microdefects are not formed in the silicon nitride layer 15 during the implantation step due to the masking of the pyrolytic oxide layer 25. The remaining steps as shown by FIGS. 7 and 8 are the same as FIGS. 3 and 4, respectively, except for a slight etching of the pyrolytic oxide 25 in the emitter window area 18 due to an oversized window in the photoresist so as to reduce the alignment tolerances.

To establish the reduction in pipe density, the following data was gathered using the test technique described in U.S. Pat. No. 3,846,259, which is incorporated by reference. Silicon wafers were fabricated using the process steps of FIGS. 1 – 4, with one-half the wafer being implanted and one-half not being implanted. Following the same procedure, additional wafers were fabricated using the process of FIGS. 5 – 8.

| | Pipe Density (# of pipes/mil$^2$) | | | | | |
|---|---|---|---|---|---|---|
| | 6 × 5 mil$^2$ emitters | | | 0.3 × 0.3 mil$^2$ emitters | | |
| Side of Wafer | Zone I | Zone II | Zone III | Zone I | Zone II | zone III |
| FIGS. 1-4 Process | | | | | | |
| Implant | 0.0009 | 0.0009 | 0.0016 | 0.0033 | 0.0048 | 0.0071 |
| Non-Implant | 0.0014 | 0.0027 | 0.0066 | 0.0133 | 0.0213 | 0.0382 |
| FIGS. 5-8 Process | | | | | | |
| Implant | 0.0016 | 0.0015 | 0.0025 | 0.0065 | 0.0072 | 0.0054 |
| Non-Implant | 0.0105 | 0.0129 | 0.0100 | 0.0557 | 0.0602 | 0.0412 |

It can be clearly seen by the above data that the pipe density is substantially reduced or minimized in the emitters formed subsequent to the implantation step in accordance with the present invention versus the emitters formed without an implantation step.

Utilizing transmission electron microscopy and stereomicroscopy it was seen that damage caused by preemitter argon implant produces a large number of nuclei for dislocation loops and small precipitates (i.e. 50 – 100 A). During subsequent emitter diffusion, many dislocation loops (200 – 300 A in diameter) are formed in the shallow damaged region herein which is about 1000 A in depth. Because of their small size, these dislocation loops do not propagate into one or more junctions and thus considered harmless. In absence of implant induced damages, only few large dislocation loops 1 – 2$\mu$ in diameter are formed during emitter diffusion. These loops extend beyond one or more junctions and are electrically harmful.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. In the method of manufacture of a semiconductor device, a method of forming an emitter region with a substantial reduction in the number of pipes which result in shorts or leakages between two regions of identical conductivity, comprising the steps of;

forming a base region of a semiconductor device, and
   introducing nucleation sites for dislocation loops by ion implanting non-dopant ions into said base region of the semiconductor device to be subsequently doped with emitter type impurity, said nucleation sites being formed near the front surface of said base region of said device, and
   subsequently introducing emitter type impurity into said region to form the emitter region whereby said nucleation sites are converted into small electrically harmless dislocation loops thereby reducing the number of pipes.

2. The method of claim 1 wherein said semiconductor device is an NPN transistor.

3. The method of claim 1 wherein said nucleation sites are, in addition, introduced into the base region of said semiconductor device which will remain as the base region and not be subsequently converted to an emitter region.

4. The method of claim 1 wherein said ions are selected from the group consisting of helium, neon, argon, krypton, xenon, silicon and oxygen.

5. The method of claim 1 wherein said ions are implanted through a silicon oxide layer sufficiently thin so as to permit the ions to pass through said oxide layer, but sufficiently thick to retard the energy of the ions so that the ions are implanted in the base region just below the interface of said oxide and base region.

6. The method of claim 1 wherein said ions are implanted to a depth not greater than about 25% of the depth of the emitter region which is subsequently formed.

7. The method of claim 4 wherein said ions are argon.

8. The method of claim 4 wherein said ions are silicon.

9. The method of claim 1 wherein said ions are implanted into a silicon oxide layer with sufficient energy so that upon striking silicon atoms in said layer, the silicon atoms are driven into the base region to create said nucleation sites.

* * * * *